United States Patent
Luo et al.

(10) Patent No.: US 7,936,006 B1
(45) Date of Patent: May 3, 2011

(54) SEMICONDUCTOR DEVICE WITH BACKFILLED ISOLATION

(75) Inventors: Yuhao Luo, San Jose, CA (US); Deepak Kumar Nayak, Fremont, CA (US); Daniel Gitlin, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 1133 days.

(21) Appl. No.: 11/244,566

(22) Filed: Oct. 6, 2005

(51) Int. Cl.
*H01L 29/66* (2006.01)

(52) U.S. Cl. .......... 257/327; 257/336; 257/E29.266; 257/E21.435; 438/163; 438/290; 438/299; 438/339

(58) Field of Classification Search .......... 257/288, 257/339, 626, 243, 327, 336, 344, 616, E29.012, 257/E29.278, E29.435, E29.266, E29.269, 257/E21.435; 438/197, 299, 300, 163, 174, 438/175, 194, 196, 282, 289, 290, 339
See application file for complete search history.

(56) References Cited

U.S. PATENT DOCUMENTS

| | | | |
|---|---|---|---|
| 4,894,694 A * | 1/1990 | Cham et al. | 257/344 |
| 4,985,744 A | 1/1991 | Spratt et al. | |
| 5,650,340 A * | 7/1997 | Burr et al. | 438/286 |
| 5,696,012 A | 12/1997 | Son | |
| 5,854,509 A * | 12/1998 | Kunikiyo | 257/506 |
| 5,989,986 A | 11/1999 | Hsieh | |
| 5,989,992 A * | 11/1999 | Yabu et al. | 438/612 |
| 6,075,262 A | 6/2000 | Moriuchi et al. | |
| 6,157,064 A | 12/2000 | Huang | |
| 6,177,319 B1 | 1/2001 | Chen | |
| 6,262,445 B1 | 7/2001 | Swanson et al. | |
| 6,287,988 B1 * | 9/2001 | Nagamine et al. | 438/770 |
| 6,306,712 B1 | 10/2001 | Rodder et al. | |
| 6,399,973 B1 * | 6/2002 | Roberds | 257/288 |
| 6,541,343 B1 | 4/2003 | Murthy et al. | |
| 6,563,152 B2 * | 5/2003 | Roberds et al. | 257/288 |
| 6,573,172 B1 | 6/2003 | En et al. | |
| 6,713,360 B2 | 3/2004 | Jain et al. | |
| 6,743,684 B2 | 6/2004 | Liu | |
| 6,870,179 B2 | 3/2005 | Shaheed et al. | |
| 6,906,393 B2 | 6/2005 | Sayama et al. | |
| 6,939,814 B2 | 9/2005 | Chan et al. | |
| 6,995,430 B2 * | 2/2006 | Langdo et al. | 257/352 |
| 7,022,561 B2 | 4/2006 | Huang et al. | |
| 7,052,964 B2 | 5/2006 | Yeo et al. | |
| 7,053,400 B2 | 5/2006 | Sun et al. | |
| 7,132,704 B2 | 11/2006 | Grudowski | |
| 7,138,309 B2 | 11/2006 | Lee et al. | |
| 7,193,254 B2 | 3/2007 | Chan et al. | |
| 7,208,362 B2 | 4/2007 | Chidambaram | |

(Continued)

OTHER PUBLICATIONS

Yuhao Luo, et al., "Strain-silicon CMOS Using Etch-stop Layer And Method Of Manufacture", U.S. Appl. No. 11/146,640, filed Jun. 7, 2005, 17 pages, available from Xilinx Inc., 2100 Logic Drive, San Jose, CA 95124.

(Continued)

*Primary Examiner* — Matthew C Landau
*Assistant Examiner* — Collen E Snow
(74) *Attorney, Agent, or Firm* — Scott Hewett; Thomas George

(57) ABSTRACT

An MOS device has an embedded dielectric structure underlying an active portion of the device, such as a source extension or a drain extension. In an alternative embodiment, an embedded dielectric structure underlies the channel region of a MOS device, as well as the source and drain extensions.

17 Claims, 10 Drawing Sheets

U.S. PATENT DOCUMENTS

| | | |
|---|---|---|
| 7,256,084 B2 | 8/2007 | Lim et al. |
| 7,259,105 B2 | 8/2007 | Kim |
| 7,265,419 B2 | 9/2007 | Minami |
| 7,288,448 B2 | 10/2007 | Orlowski et al. |
| 7,314,793 B2 | 1/2008 | Frohberg et al. |
| 7,423,283 B1 | 9/2008 | Luo et al. |
| 7,429,775 B1 | 9/2008 | Nayak et al. |
| 7,528,028 B2 | 5/2009 | Liang et al. |
| 2005/0040460 A1 | 2/2005 | Chidambarrao et al. |
| 2005/0136606 A1 | 6/2005 | Rulke et al. |
| 2005/0247986 A1 | 11/2005 | Ko et al. |
| 2005/0260817 A1 | 11/2005 | Kim |
| 2005/0285187 A1 | 12/2005 | Bryant et al. |
| 2006/0009041 A1 | 1/2006 | Iyer et al. |
| 2006/0014350 A1 | 1/2006 | Wang et al. |
| 2006/0189167 A1 | 8/2006 | Wang et al. |
| 2006/0244074 A1 | 11/2006 | Chen et al. |
| 2006/0267106 A1 | 11/2006 | Chao et al. |
| 2007/0001217 A1 | 1/2007 | Chen et al. |
| 2007/0004123 A1* | 1/2007 | Bohr et al. .................. 438/230 |
| 2007/0010073 A1 | 1/2007 | Chen et al. |
| 2007/0034963 A1 | 2/2007 | Sudo |

OTHER PUBLICATIONS

Deepak Kumar Nayak, et al, "CMOS Device With Stressed Sidewall Spacers", U.S. Appl. No. 11/221,507, filed Sep. 8, 2005, 13 pages, available from Xilinx Inc., 2100 Logic Drive, San Jose, CA 95124.

U.S. Appl. No. 11/146,640, filed Jun. 7, 2005, Luo et al.

U.S. Appl. No. 11/221,507, filed Sep. 8, 2005, Nayak et al.

T. Ghani et al., "A 90nm High Volume Manufacturing Logic Technology Featuring Novel 45nm Gate Length Strained Silicon CMOS Transistors", IEEE, 2003, pp. 1-3, available from tahr.ghani@intel.com, or Intel Corporation (Santa Clara) Corporate Office, 2200 Mission College Blvd., Santa Clara, California 95052-8119.

Min Chin Chai, "90 nm Node CMOS Technology Comparison between Intel Corporation and Samsung Electronics", pp. 1-6, May 8, 2003 available from Intel Corporation (Santa Clara) Corporate Office, 2200 Mission College Blvd., Santa Clara, California 95052-8119.

B. P. R. Chidambaram et al., "35% Drive Current Imporvement from Recessed-SiGe Drain Extensions on 37 nm Gate Length PMOS", 2004 Sumposium on VLSI Technology Digest of Technical Papers, pp. 48-49, available from Texas Instruments, MS 3739, 13560 N. Central-Expressway, Dallas, TX 75243.

Pidin, S. et al., "A Novel Strain Enhanced CMOS Architecture Using Selectively Deposited High Tensile and High Compressive Silicon Nitride Films", IEEE 2004, pp. 1-8, available from IEEE, 3 Park Avenue, 17th Floor, New York, NY 10016-5997.

Thompson, S. et al.,"A 90 nm Logic Technology Featuring 50 nm Strained Silicon Channel Transistors, 7 Layers of Cu Interconnects, Low K ILD, and 1 um2 SRAM Cell", iedm 2002, pp. 1-32, available from Intel Corporation, www.intel.com/research/silicon.

Luo, Y. et al., "Enhancement of CMOS Performance by Process-Induced Stress", IEEE Transactions on Semiconductors Manufacturing, vol. 18, No. 1, Feb. 2005, pp. 63-68.

U.S. Appl. No. 11/146,640, Luo, Y. et al. "Strain-Silicon CMOS using Etch-Stop Layer and Method of Manufacture", filed Jun. 7, 2005, Xilinx Inc., 2100 Logic Drive, San Jose, CA 95124.

U.S. Appl. No. 11/221,507, Nayak, D.K. et al., "CMOS Device With Stressed Sidewall Spacers", filed Sep. 8, 2005, Xilinx Inc., 2100 Logic Drive, San Jose, CA 95124.

U.S. Appl. No. 11/095,814, Nayak et al.,"Method of Fabricating Strain-Silicon CMOS", filed Mar. 31, 2005, Xilinx, Inc. 2100 Logic Drive, San Jose, CA 95124.

Brand, A. et al., "Intel's 0.25 Micron, 2.0Volts Logic Process Technology", pp. 1-9, available from Intel Corporation (Santa Clara) Corporate Office, 2200 Mission College Blvd., Santa Clara, California 95052-8119, Intel Technology Journal Q3'98 (Third Quarter 1998).

U.S. Appl. No. 12/200,851, filed Aug. 28, 2008, Luo et al. Xilinx, Inc. 2100 Logic Drive, San Jose, California.

U.S. Appl. No. 12/200,871, filed Aug. 28, 2008, Nayak et al., Xilinx, Inc. 2100 Logic Drive, San Jose, California.

* cited by examiner

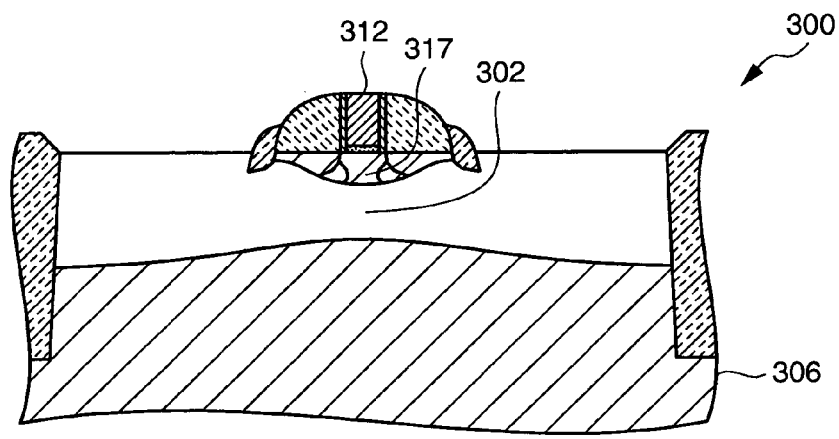
FIG. 3A
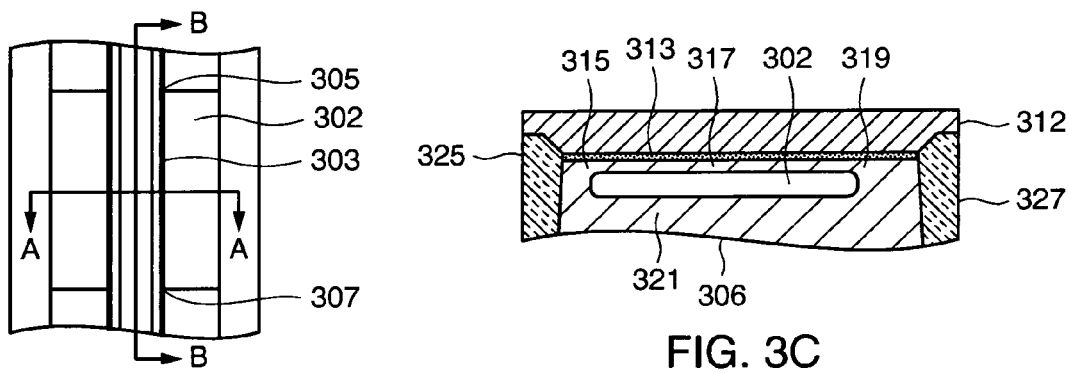
FIG. 3B
FIG. 3C
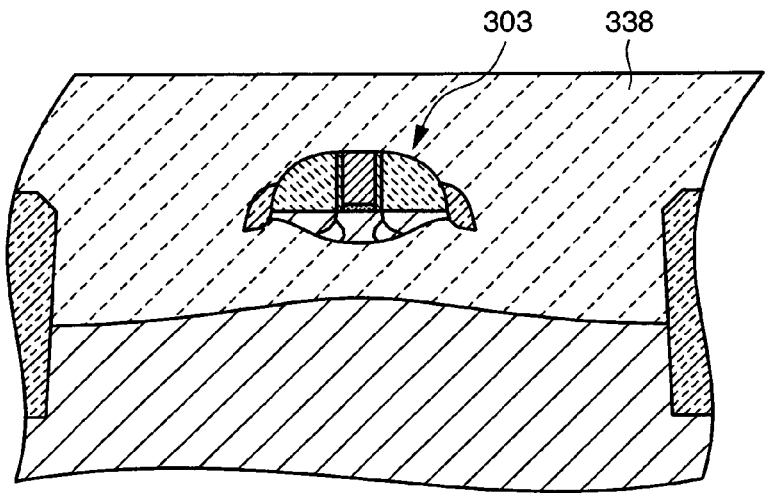
FIG. 3D

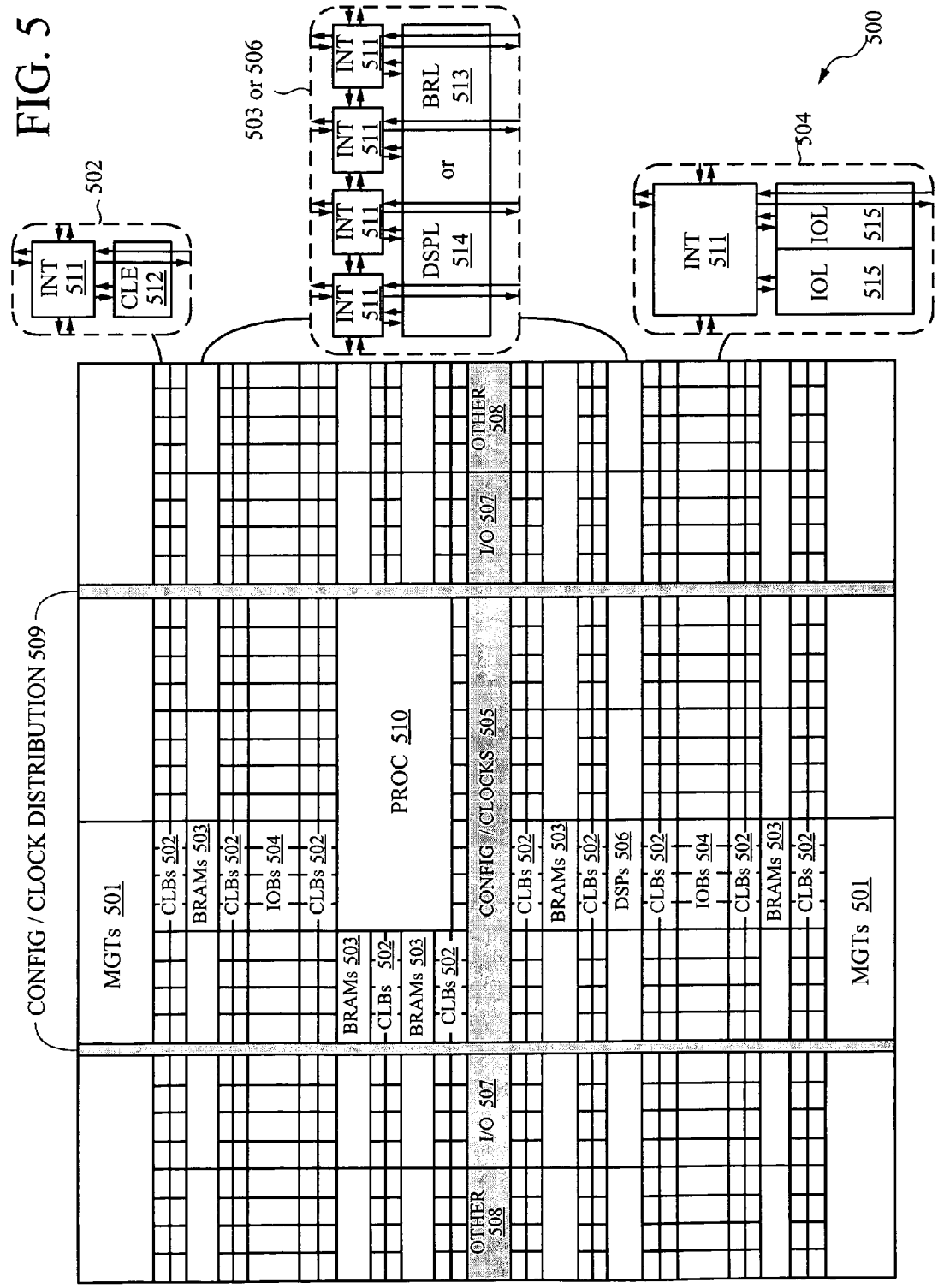

US 7,936,006 B1

SEMICONDUCTOR DEVICE WITH BACKFILLED ISOLATION

FIELD OF THE INVENTION

The present invention relates generally to semiconductor devices, and more particularly to an embedded isolation structure between source and drain contacts.

BACKGROUND OF THE INVENTION

Many integrated circuits ("ICs") are made up of millions of interconnected devices, such as transistors, resistors, capacitors, and diodes, on a single chip of semiconductor substrate. It is generally desirable that ICs operate as fast as possible, and consume as little power as possible. There is also a continuing effort to reduce the size of devices in ICs to result in more chips per substrate, and/or with greater functionality. However, as device sizes shrink, certain parasitic effects increase.

One problem that arises in metal-oxide-semiconductor ("MOS") transistors, which are commonly used in ICs, is internal leakage between the source and the drain. Internal current leakage is one of the limiting factors in reducing device size. As the source becomes closer to the drain (i.e., as the channel length of a MOS transistor is reduced), the drain potential is more likely to couple into the channel, which results in drain-induced barrier lowering ("DIBL"). DIBL can result in failure of a transistor having a short channel length.

Another problem involves current leakage from the source and drain to the substrate. Although the source typically forms a reversed-biased PN junction with the substrate, as the physical dimensions decrease the PN junction current increases. The parasitic capacitances of the source and drain with the substrate also become increasingly important.

One approach to reducing current leakage has been to use a semiconductor-on-insulator ("SOI") substrate, which generally surrounds each active device with insulating material(s). However, in SOI approaches the body of a device floats, creating an ambiguous voltage between the source/drain and the body that depends on the biasing history and recombination mechanisms of the device. This undesirable effect is referred to as the "floating body effect."

It is desirable to provide a MOS device having reduced channel leakage and parasitic capacitance, while avoiding the floating body effect.

SUMMARY OF THE INVENTION

An MOS device has an embedded dielectric structure underlying an active portion of the device, such as a source extension or a drain extension. In a further embodiment, an embedded dielectric structure underlies the channel region of a MOS device, as well as the source and drain extensions.

BRIEF DESCRIPTION OF THE DRAWINGS

FIG. 3A is a transverse cross section of a partially fabricated MOS device according to another embodiment of the invention.

FIG. 3B is a plan view of the partially fabricated MOS device of FIG. 3A.

FIG. 3C is a longitudinal cross section of the partially fabricated MOS device of FIG. 3A.

FIGS. 3D-3G are cross sections illustrating further steps of forming an MOS device according to FIG. 3A.

FIG. 5 is a plan view of an FPGA 500 with MOS devices according to an embodiment of the invention.

DETAILED DESCRIPTION OF THE DRAWINGS

FIGS. 1A-1H are cross sections illustrating steps of forming an MOS device according to an embodiment of the invention. In a particular embodiment, the MOS device may be part of a CMOS cell. The MOS device may be either an N-type MOS device or a P-type MOS device, and in a particular embodiment, both the P-type and the N-type MOS FETs (field effect transistors) in a CMOS cell are according to embodiments of the invention. CMOS cells according to embodiments are desirable in ICs such as application specific integrated circuits ("ASICs"), and programmable integrated circuits such as field-programmable gate arrays ("FPGAs"). Leakage current is especially a concern in an FPGA because of the relatively high percentage of idle transistors compared to other types of ICs.

Figure 1A:
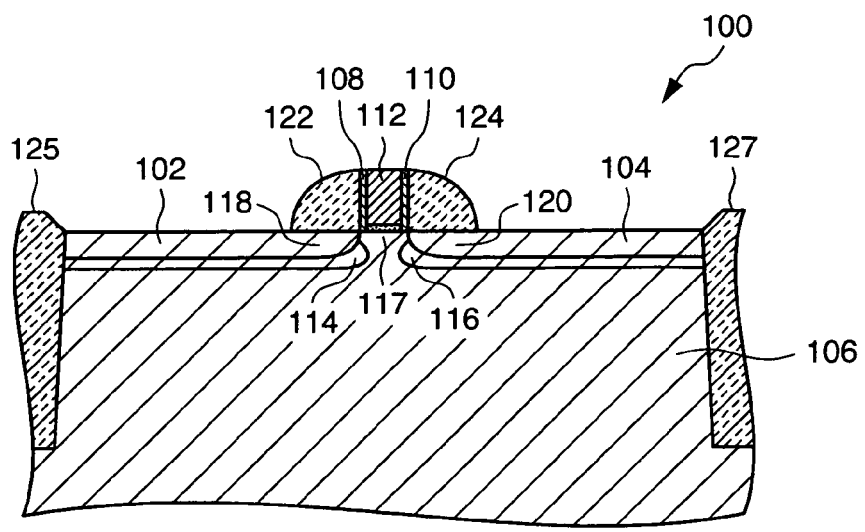
FIGS. 1A-1H are cross sections illustrating steps of forming an MOS device according to an embodiment of the invention.

FIG. 1A is a simplified cross section of a partially fabricated MOS device 100 suitable for an embodiment of the invention. Lightly doped source/drain regions 102, 104 (commonly called lightly doped drain ("LDD") regions) have been formed in the semiconductor substrate 106. The LDD regions 102, 104 are typically formed using an implantation technique and are self-aligned to first sidewall spacers 108, 110 on the sides of a gate electrode 112. In a particular embodiment, the semiconductor substrate 106 is a silicon wafer; however, many suitable semiconductor substrates may be used in embodiments. Typically, many ICs are fabricated on a substrate that is later separated into individual IC chips. In a particular embodiment, the gate electrode 112 is what is commonly called a "polysilicon gate;" however, other gate material(s) are used in alternative applications.

A "halo" implant has formed halo regions 114, 116 that extend slightly under the gate electrode 112, in other words, the halo regions 114, 116 extend under a channel region 117. Halo, or pocket, implants moderate short-channel effects in very short MOSFETs. Short channel effects include lowering of the threshold voltage and increasing subthreshold slope as gate length decreases. Halo formation is usually accomplished by implanting a dopant type opposite to the source/drain doping, (e.g., by implanting boron in N-type FETs). A high energy is used for the halo implant to move it under the gate beyond the extent of source/drain extensions 118, 120, which are usually lightly doped and implanted at significantly lower energies than the halo dopant. As a result the dopant of the halo is often placed deeper than the dopant of the source/drain extensions. The halo implantation is also self-aligned to the first sidewall spacers 108, 110.

Second sidewall spacers 122, 124 have been formed over the first sidewall spacers 108, 110 on the sides of the gate electrode 112. The source/drain extensions 118, 120 extend beneath the second sidewall spacers 122, 124 from source/drain contacts (see FIG. 1H, ref. nums. 144, 146). Isolation regions 125, 127, which in a particular embodiment are dielectric-filled trenches, isolate the MOS device 100 from adjacent electrical devices on an IC chip.

Figure 1B:
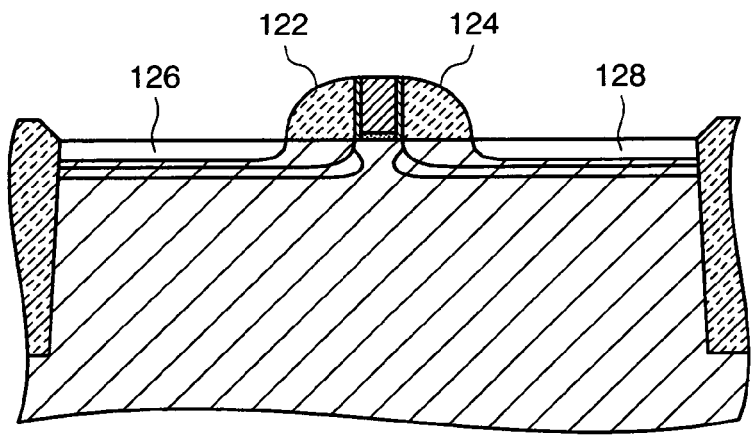

FIG. 1B shows the partially fabricated MOS device of FIG. 1A after selectively etching silicon from the source drain regions to form first recesses 126, 128. In a particular embodiment, a photomask used to define source/drain implant areas (commonly called the "source/drain mask"). Photoresist remaining from the source/drain exposure covers the gate electrode 112 to avoid etching the polysilicon gate. The first recesses 126, 128 are aligned to the second sidewall spacers 122, 124 and do not extend through the LDD regions 102, 104. In an alternative embodiment, the first recesses extend beyond the LDD regions, and may extend beyond the halo region. The depth of the first recesses depends on the desired shape of the embedded isolation structure and device geometry.

Figure 1C:
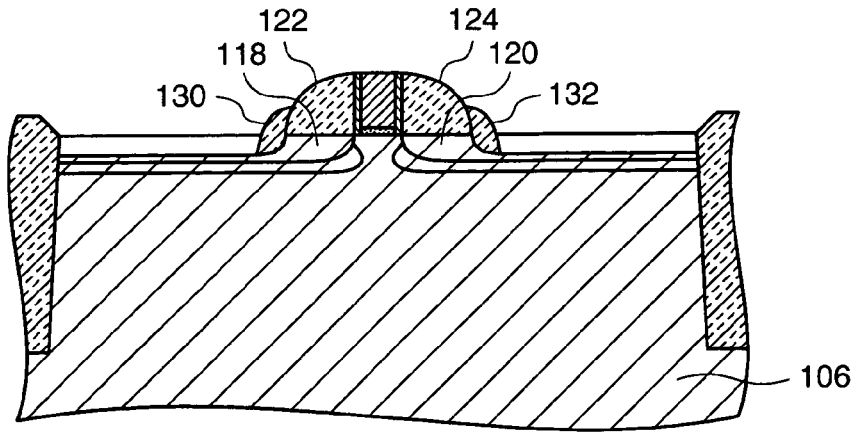

FIG. 1C shows the partially fabricated MOS device of FIG. 1B after source/drain spacers 130, 132 have been formed. The source/drain spacers 130, 132 are formed by depositing a layer of suitable material, and then anisotropically etching the layer. It is desirable to be able to remove (etch) the material of the source/drain spacers in a selective fashion from the material of the second sidewall spacers 122, 124, and from the material of the substrate 106. In a particular embodiment, the substrate 106 is silicon, the second sidewall spacers are silicon dioxide ("SiO$_2$"), and the source/drain spacers 130, 132 are silicon nitride ("SiN"). Alternative embodiments use other combinations of materials. The source/drain spacers 130, 132 protect the source/drain extensions 118, 120 from etch-off in a subsequent silicon etch that forms reentrant recesses.

FIG. 10 shows the partially fabricated MOS device of FIG. 1C after reentrant recesses 134, 136 have been etched into the substrate 106. An etch selective for silicon that does not appreciably remove the SiN of the source/drain spacers 130, 132 or the SiO$_2$ of the second sidewall spacers 122, 124 is used. In a particular embodiment, an anisotropic etch is used to etch the reentrant recesses to a selected depth, and then an isotropic etch, such as a wet etch, is used to form the undercut and to further deepen the reentrant recesses. Alternatively, only a wet etch is used.

The reentrant recesses extend towards each other below the source/drain spacers 130, 132 and below portions of the source/drain extensions 118, 120. In other words, an undercut is formed beneath the second sidewall spacers 122, 124 and portions of the halo regions and source/drain extension regions are removed. Replacing part of the LDD/halo material with dielectric material reduces the short-channel effect and reduces channel leakage current. Reducing the area of the halo/LDD junction lowers the body-to-source/drain junction capacitance and lowers junction leakage current.

A web 137 of substrate material (e.g., silicon) connects the channel region 117 to the body of the substrate 106 along the entire width of the channel, which is desirable because it avoids floating body effects. In alternative embodiments, the reentrant recesses extend below the channel 117, and in particular embodiments join to form a single reentrant recess beneath the channel 117 (see, e.g., FIG. 3A), with the channel connected to the body of the substrate at one or both ends of the channel width, which acceptably avoids floating body effects in some applications. However, the web 137 connects the channel region to the body of the substrate in a continuous fashion, providing a superior structure for avoiding floating body effects.

Figure 1D:
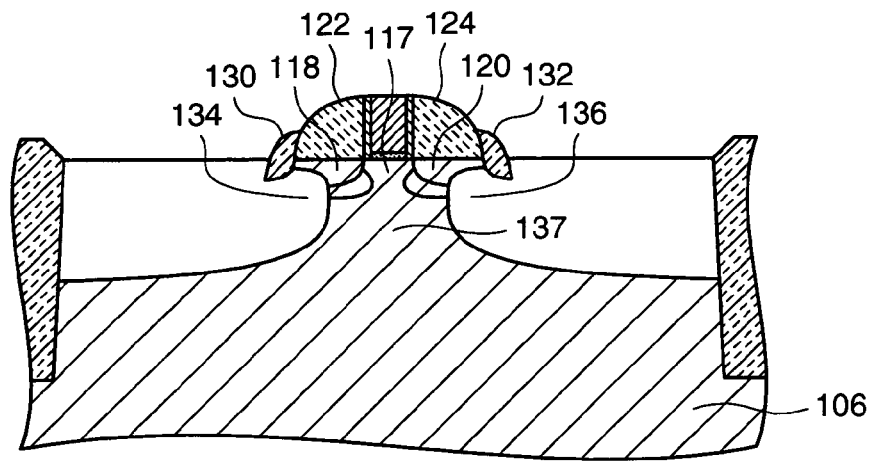
Figure 1E:
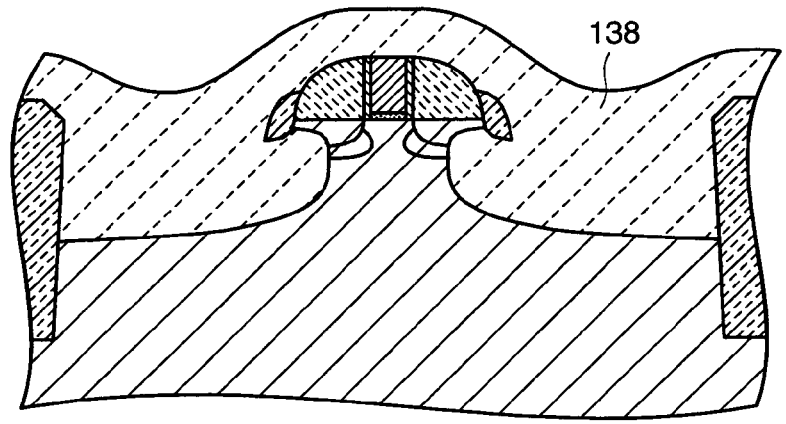

FIG. 1E shows the partially fabricated MOS device of FIG. 1D after dielectric material 138 has been backfilled into the reentrant recesses (FIG. 1D, ref. nums. 134, 136). The dielectric material 138 is preferably what is commonly known as a "low-k" material. The dielectric material may be deposited, as with fluorinated silica glass ("FSG"), silicon carbide-based dielectric material, such as CORAL™ dielectric materials developed by NOVELLUS SYSTEMS, INC., of San Jose, Calif., and silicon oxide-based dielectric material, such as BLACK DIAMOND™ dielectric materials developed by APPLIED MATERIALS, INC., of Santa Clara, Calif. Alternatively, the dielectric material may be applied in a fluid form and cured, such as a spin-on dielectric material. Suitable spin-on dielectric materials are sold under the trade name SILK by Dow of Midland, Mich. Note that the dielectric materials mentioned above are merely examples of commercially available dielectrics, and other known dielectric material may also be used in accordance with embodiments of the invention.

Figure 1F:
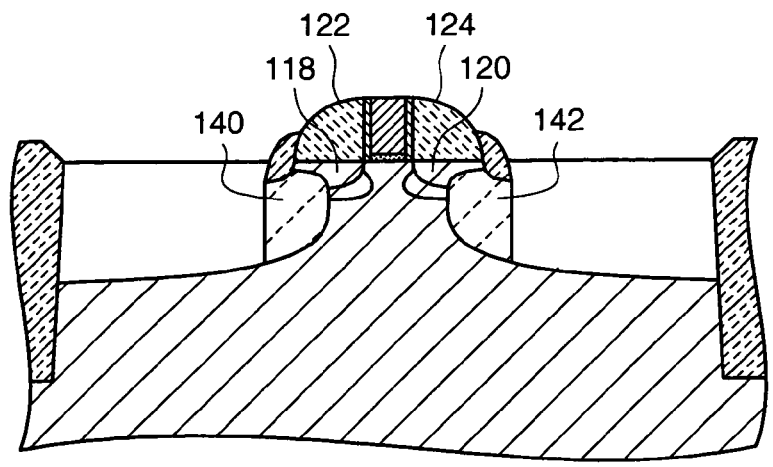
Figure 1G:
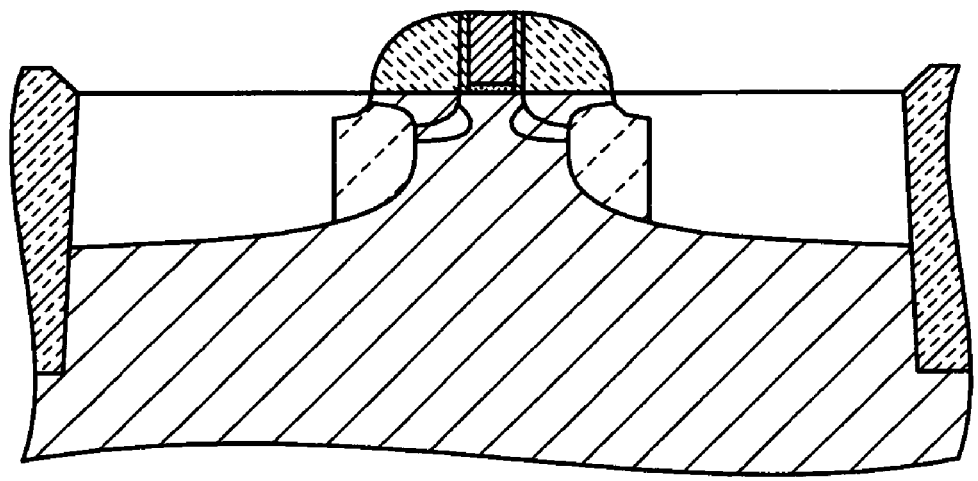

FIG. 1F shows the partially fabricated MOS device of FIG. 1E after the dielectric material has been removed, except for embedded dielectric structures 140, 142. The embedded dielectric structures 140, 142 extend beneath the second sidewall spacers 122, 124 and beneath the source/drain extensions 118, 120. As used herein, the term "embedded" means that at least a portion of the embedded dielectric structure lies beneath active silicon, such as LDD, halo, source/drain extension regions, and/or the channel. FIG. 1G shows the partially fabricated MOS device of FIG. 1F after the source/drain spacers (see FIG. 1D, ref. nums. 130, 132) have been removed. In a particular embodiment, the source/drain spacers are SiN, and are removed using a wet etch process.

Figure 1H:
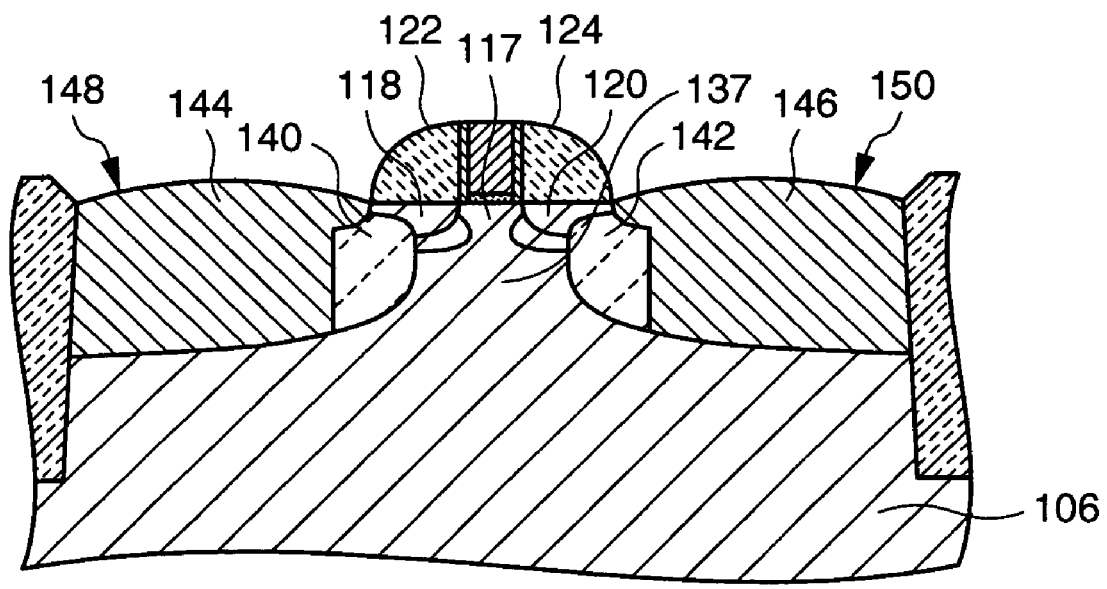

FIG. 1H shows the partially fabricated MOS device of FIG. 1G with source/drain contacts 144, 146. In a particular embodiment, the source/drain contacts 144, 146 are formed using a selective epitaxy growth ("SEG") technique. The source/drain contacts 144, 146 are SEG silicon, or alternatively, SEG SiGe or SEG SiC. During SEG, material grows on the exposed Si in the source/drain areas, i.e., on the silicon exposed by the reentrant recesses (see FIG. 1D, ref. nums. 134, 136), but not covered by the embedded dielectric structures 140, 142. In yet other embodiments, the source/drain contacts are deposited using chemical vapor deposition ("CVD") techniques. Material formed by either SEG or CVD can be doped in situ to form source and drain terminals 148, 150. In particular embodiments, doping is graded so that the material at the bottom of the contacts is less doped than the material at the top of the contacts. Alternatively, a conventional source/drain implant is performed into the contact material to form the source drain terminals. A silicidation process typically follows (not shown), as is common in the art.

The source/drain contacts 144, 146 are adjacent and electrically connected to the source/drain extensions 118, 120. The embedded dielectric structures 140, 142 extend beneath the second sidewall spacers 122, 124, which reduces the capacitance between the source/drain and the substrate (device body). The terms "source" and "drain" are used solely for purposes of convenient discussion. Reducing sidewall capacitance is particularly important in short-channel devices because, as devices are scaled down, the percentage of the peripheral portion of the junction capacitance under the gate ("$C_{jswg}$") in the total capacitance increases. The embedded dielectric structures 140, 142 also reduce channel leakage current, thus reducing power consumption of the MOS device, and improve DIBL. The web 137 between the embedded dielectric structures 140, 142 connects the channel 117 to the body (bulk) of the substrate 106, thus avoiding the floating body effect that often arises with SOI devices having a channel isolated from the bulk of the semiconductor substrate.

FIGS. 2A-2J illustrate an alternative processing sequence according to another embodiment of the invention. FIGS. 2A-2J are more easily understood in light of the detailed description of FIGS. 1A-1H. Basically, the embedded dielectric in the embodiment of FIGS. 2A-2J is formed after the halo implant and before the source/drain pocket fill and LDD implant. This improves conductivity in the LDD regions because the LDD implant is not adversely compensated by the halo implant, which is a different dopant type. This also allows a reentrant recess to be more easily formed under the channel region of a device, and facilitates subsequent filling with dielectric material to form an embedded dielectric structure extending beneath the channel region.

Figure 2A:
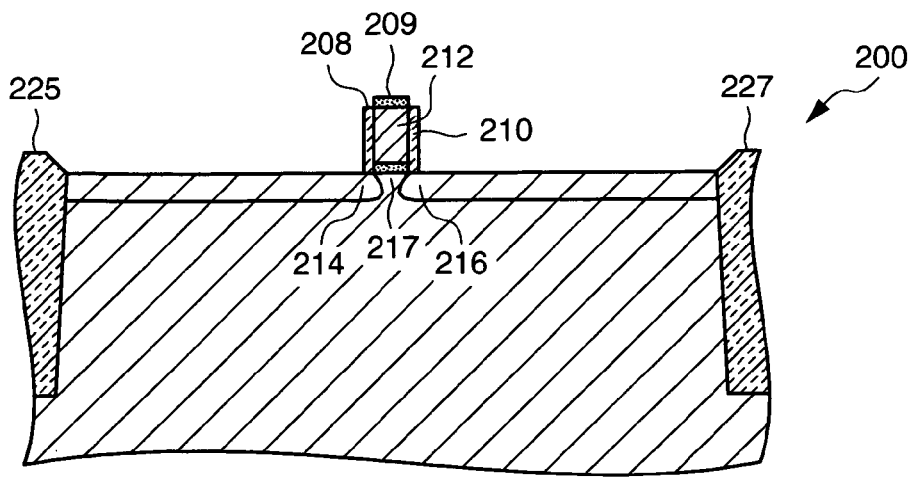
FIGS. 2A-2J are cross sections illustrating steps of forming a MOS device according to another embodiment of the invention.

FIG. 2A is a simplified cross section of a partially fabricated MOS device 200 suitable for an embodiment of the invention. A "halo" implant has formed halo regions 214, 216 that extend slightly under the gate electrode 212, in other words, the halo regions 214, 216 extend under a channel region 217. Halo, or pocket, implants moderate short-channel effects in very short MOSFETs. Short channel effects include lowering of the threshold voltage and increasing subthreshold slope as gate length decreases. Halo formation is usually accomplished by implanting a dopant type opposite to the source/drain doping, (e.g., by implanting boron in N-type FETs). A high energy is used for the halo implant to move it under the gate. As a result the dopant of the halo is often placed deeper than the dopant of the source/drain extensions, which in this embodiment occur after formation of the embedded dielectric structure (see FIG. 2I). The halo implantation is self-aligned to the first sidewall spacers 208, 210.

A gate cap layer 209 is also shown. The gate cap layer 209 protects gate silicon during subsequent silicon etch steps, and is removed prior to the source/drain implant since the poly gate is also doped during this implant. This is needed in the first embodiment as well. Isolation regions 225, 227, which in a particular embodiment are dielectric-filled trenches, isolate the MOS device 200 from adjacent electrical devices on an IC chip.

Figure 2B:
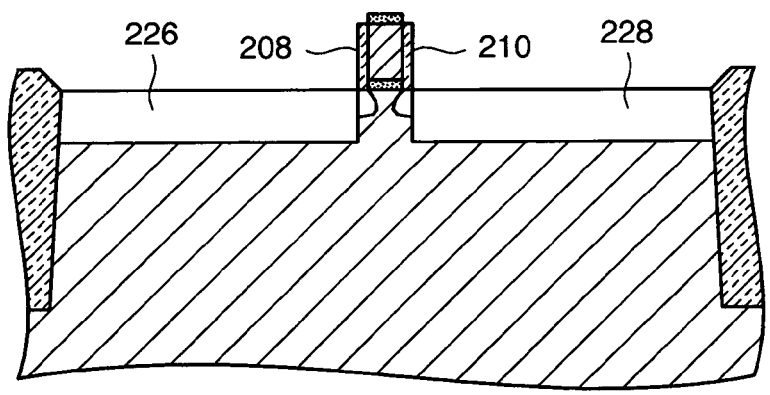

FIG. 2B shows the partially fabricated MOS device of FIG. 2A after selectively etching silicon from the source drain regions to form first recesses 226, 228. The first recesses 226, 228 are aligned to the first sidewall spacers 208, 210.

Figure 2C:
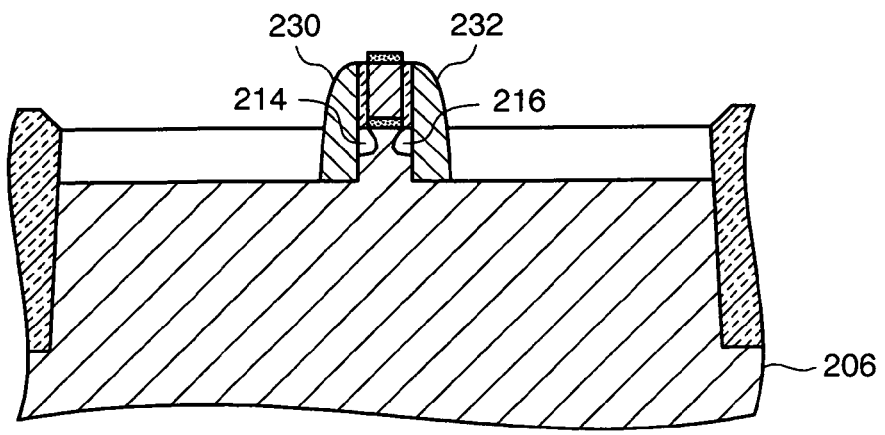

FIG. 2C shows the partially fabricated MOS device of FIG. 2B after source/drain spacers 230, 232 have been formed. The source/drain spacers 230, 232 are formed by depositing a layer of suitable material, and then anisotropically etching the layer. It is desirable to be able to remove (etch) the material of the source/drain spacers in a selective fashion from the material of the substrate 206. In a particular embodiment, the substrate 206 is silicon, the first sidewall spacers are silicon dioxide, and the source/drain spacers are silicon nitride ("SiN"). Alternative embodiments use other combinations of materials. The source/drain spacers protect the halo regions 214, 216 from etch-off in a subsequent silicon etch that forms reentrant recesses.

Figure 2D:
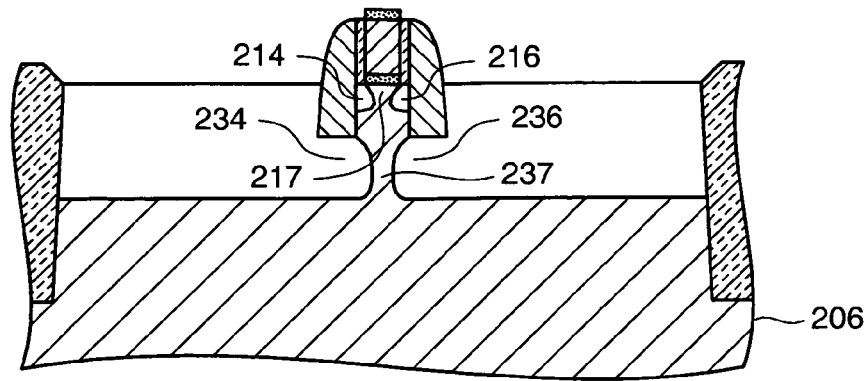

FIG. 2D shows the partially fabricated MOS device of FIG. 2C after reentrant recesses 234, 236 have been etched into the substrate 206. An etch selective for silicon that does not appreciably remove the SiN of the source/drain spacers 230, 232 is used. In a particular embodiment, an anisotropic etch is used to etch the reentrant recesses to a selected depth, and then an isotropic etch, such as a wet etch, is used to form the undercut and to further deepen the reentrant recesses. Alternatively, only a wet etch is used. The reentrant recesses extend towards each other below the source/drain spacers 230, 232 and below the halo regions 214, 216. In some embodiments, the reentrant recesses extend below the channel region 217. Reducing the area of the halo junction lowers the body-to-source/drain junction capacitance and lowers junction leakage current.

A web 237 of substrate material (e.g., silicon) connects the channel region 217 to the body of the substrate 206 along the entire width of the channel, which is desirable because it avoids floating body effects. In alternative embodiments, the reentrant recesses extend below the channel 217, and in particular embodiments join to form a single reentrant recess beneath the channel 217 (see, e.g., FIG. 3A), with the channel connected to the body of the substrate at one or both ends of the channel width, which acceptably avoids floating body effects in some applications. However, the web 237 connects the channel region to the body of the substrate in a continuous fashion, providing a superior structure for avoiding floating body effects.

Figure 2E:
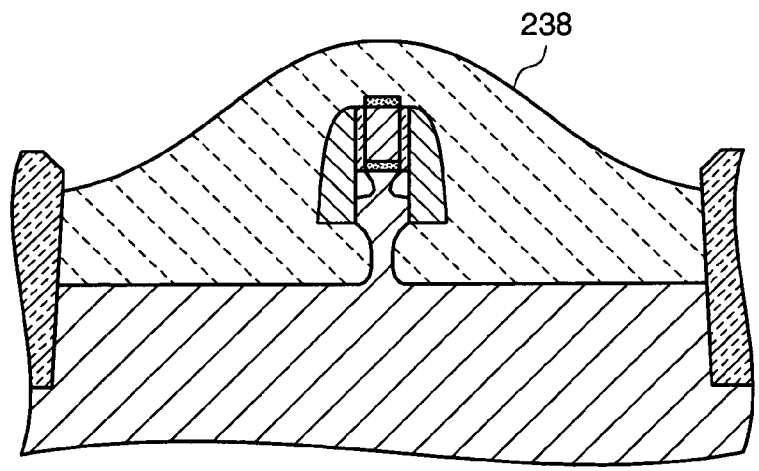

FIG. 2E shows the partially fabricated MOS device of FIG. 2D after dielectric material 238 has been backfilled into the reentrant recesses (FIG. 2D, ref. nums. 234, 236). The dielectric material 238 is preferably what is commonly known as a "low-k" material. The dielectric material is deposited, as with fluorinated silica glass ("FSG"), silicon carbide-based dielectric material, such as CORAL™ dielectric materials developed by NOVELLUS SYSTEMS, INC., of San Jose, Calif., and silicon oxide-based dielectric material, such as BLACK DIAMOND™ dielectric materials developed by APPLIED MATERIALS, INC., of Santa Clara, Calif. Alternatively, the dielectric material is applied in a fluid form and cured, such as a spin-on dielectric material. Suitable spin-on dielectric materials are sold under the trade name SILK by Dow of Midland, Mich.

Figure 2F:
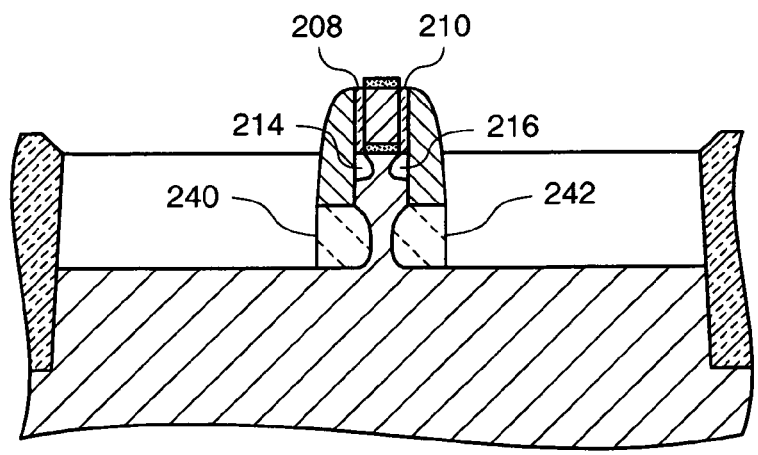

FIG. 2F shows the partially fabricated MOS device of FIG. 2E after the dielectric material has been removed, except for embedded dielectric structures 240, 242. The embedded dielectric structures 240, 242 extend beneath the first sidewall spacers 208, 210 and beneath the halo regions 214, 216. As used herein, the term "embedded" means that at least a portion of the embedded dielectric structure lies beneath active silicon, such as a halo and/or channel region.

Figure 2G:
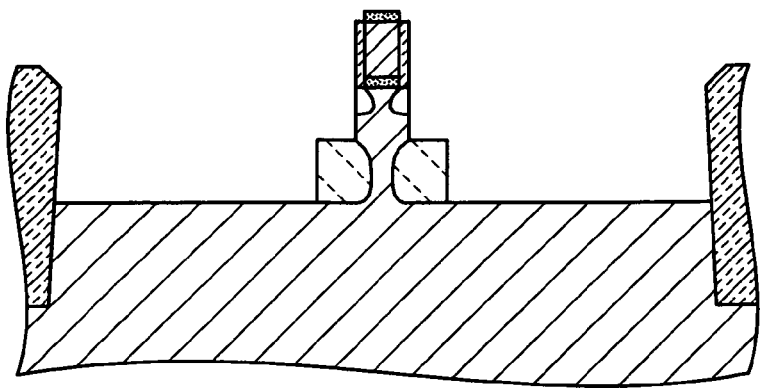

FIG. 2G shows the partially fabricated MOS device of FIG. 2F after the source/drain spacers (see FIG. 2C, ref. nums. 230, 232) have been removed. In a particular embodiment, the source/drain spacers are SiN, and are removed using a wet etch process.

Figure 2H:
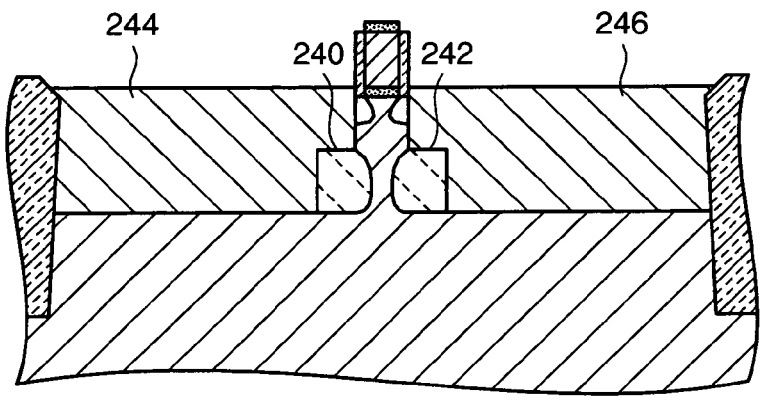

FIG. 2H shows the partially fabricated MOS device of FIG. 2G with source/drain contacts 244, 246. In a particular embodiment, the source/drain contacts 244, 246 are formed using a selective epitaxy growth ("SEG") technique. The source/drain contacts 244, 246 are SEG silicon, or alternatively, SEG SiGe or SEG SiC. During SEG, material grows on the exposed Si in the source/drain areas, i.e., on the silicon exposed by the reentrant recesses (see FIG. 2D, ref. nums. 234, 336), but not covered by the embedded dielectric structures 240, 242. In yet other embodiments, the source/drain contacts are deposited using chemical vapor deposition ("CVD") techniques. Material formed by either SEG or CVD can be doped in situ to form source and drain terminals. In particular embodiments, doping is graded so that the material at the bottom of the contacts is less doped than the material at the top of the contacts. In an alternative embodiment, the source/drain contact material is essentially undoped to facilitate forming lightly doped source/drain regions.

Figure 2I:
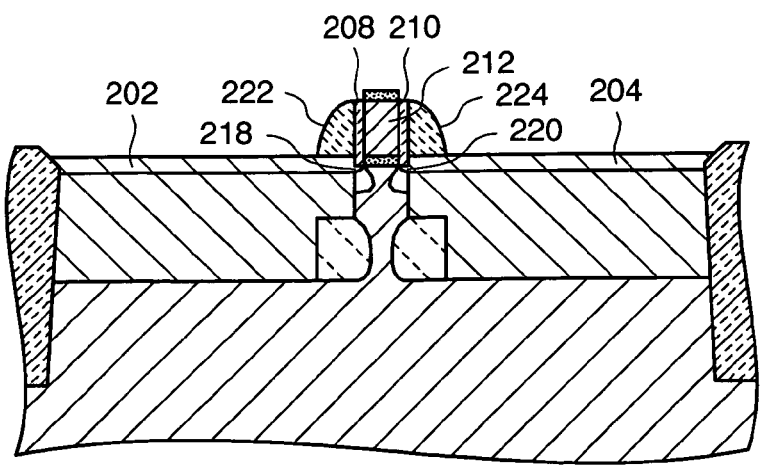

FIG. 2I shows the partially fabricated MOS device of FIG. 2H with lightly doped source/drain regions 202, 204 (commonly called lightly doped drain ("LDD") regions) formed in the source/drain contacts. The LDD regions 202, 204 are typically formed using an implantation and drive-in technique and are self-aligned to first sidewall spacers 208, 210 on the sides of a gate electrode 212. In a particular embodiment, the gate electrode 212 is what is commonly called a "polysilicon gate;" however, other gate material(s) are used in alternative applications. After the LDD implant, and before or after drive-in, second sidewall spacers 222, 224 are formed. The second sidewall spacers are typically SiN or SiO$_2$. After drive-in, the LDD regions form source/drain extensions 218, 220 that extend beneath the first sidewall spacers 208, 210.

Figure 2J:
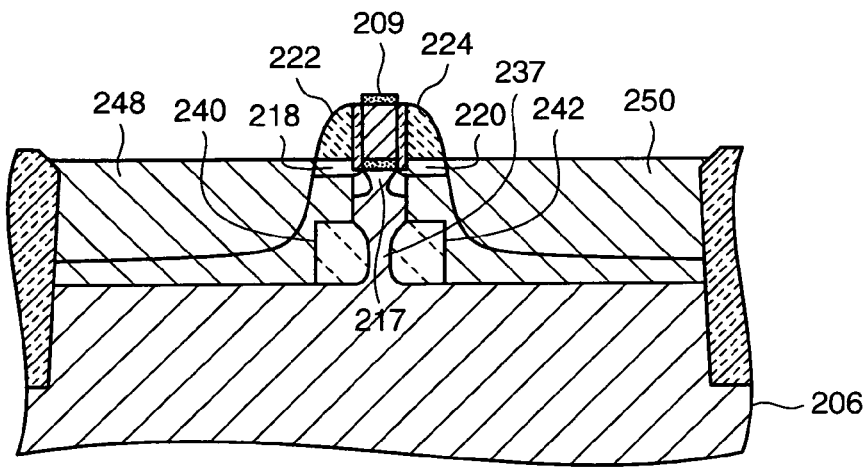

FIG. 2J shows the partially fabricated MOS device of FIG. 2I after a source/drain implant and drive-in. This source/drain implant is typically at a much higher dose and energy than either the halo implant or the LDD implant. The source/drain implant regions 248, 250 are adjacent and electrically connected to the source/drain extensions 218, 220. The embedded dielectric structures 240, 242 extend beneath the second sidewall spacers 222, 224, which reduces the capacitance. Reducing sidewall capacitance is particularly important in short-channel devices because, as devices are scaled down, the percentage of the peripheral portion of the junction capacitance under the gate ("$C_{jswg}$") in the total capacitance increases. The embedded dielectric structures 240, 242 also reduce channel leakage current, thus reducing power consumption of the MOS device, and improve DIBL. The web 237 between the embedded dielectric structures 240, 242 connects the channel 217 to the body (bulk) of the substrate 206, thus avoiding the floating body effect that often arises with SOI devices having a channel isolated from the bulk of the semiconductor substrate. After the source/drain implant and activation annealing, a silicidation process is performed. Alternatively, the poly gate is doped separately from the source/drain.

FIG. 3A is a transverse cross section of a partially fabricated MOS device 300 according to another embodiment of the invention. In a particular embodiment, the MOS device is part of a CMOS cell. The MOS device is either an N-type MOS device or a P-type MOS device, and in a particular embodiment, both the P-type and the N-type MOS FETs in a CMOS cell may be according to embodiments of the invention.

The partially fabricated MOS device 300 is similar to the cross section shown in FIG. 1D; however, an etch has been performed to create a reentrant recess 302 that extends beneath the channel region 317. In other words, silicon has been removed from the substrate 306 in the source and drain regions, continuing under the gate 312 and related structures ("gate structure") for a portion of the gate width to form the reentrant recess 302 (compare FIG. 1D, ref. nums. 134, 136). The gate structure is connected to the substrate at both ends, as shown in FIGS. 3B and 3C, by the portion(s) of the gate width that is not undercut. In particular, the recess 302 does not extend all the way to the "trench" isolation 325, 327 at either end and the channel is connected to the bulk semiconductor at both ends. Alternatively, the recess extends to the trench isolation at one end, but not the other, so that the channel is connected to the bulk semiconductor at one end.

FIG. 3B is a plan view of the partially fabricated MOS device of FIG. 3A. The cross section along section line A-A is shown in FIG. 3A. Silicon has been removed from the substrate to form the reentrant recess 302 that extends beneath the gate structure 303. The gate structure 303 is supported at both ends 305, 307 of the channel by silicon that is preferably outside of the active cell region (e.g., the well mask area). The channel (see FIG. 3A, ref. num. 317) is physically and electrically connected to the silicon body of the substrate, thus avoiding the floating body effect that arises in totally isolated channels, such as in SOI wafers. Alternatively, the gate structure is supported at one end in a cantilevered fashion. In either case, the channel remains electrically and physically connected to the body of the MOS device.

Figure 3E:
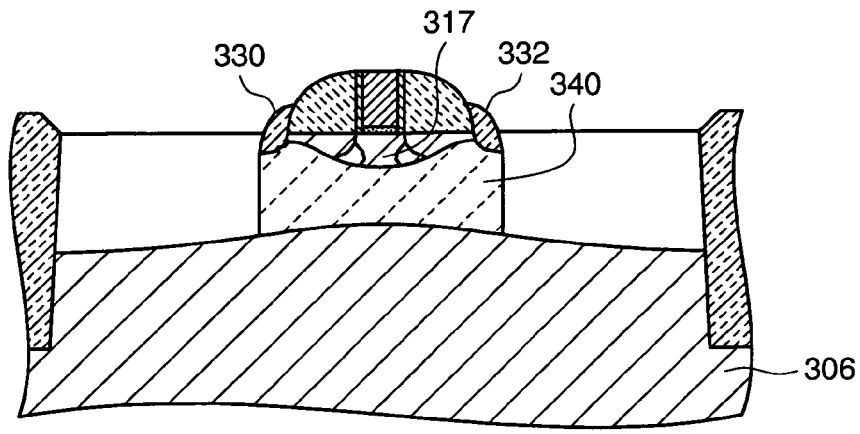

FIG. 3C is a longitudinal cross section of the partially fabricated MOS device of FIG. 3A. FIG. 3C is the cross section taken along section line B-B in FIG. 3B. The channel region 317 is physically and electrically connected to the body 321 of the silicon substrate 306 at a first end 315 and at a second end 319 of the channel region 317. The reentrant recess 302 will be filled with dielectric material to form an embedded isolation structure (see FIG. 3E, ref. num. 340). In a particular embodiment, a special mask is used to define the area from which silicon is removed to form the reentrant recess. In an embodiment, the reentrant recess(es) extends essentially to the edges of the device well, leaving a web of silicon to connect the channel to the bulk of the semiconductor. In an alternative embodiment, the reentrant recess(es) is formed under a portion of the active channel (i.e., the reentrant recess(es) does not extend all the way to the edge of the device well). The channel is connected to the substrate through the silicon left at either or both ends of the channel silicon to avoid floating body effect. The gate electrode 312 and gate dielectric 313 are also shown in this cross section.

FIGS. 3D-3G are cross sections illustrating further steps of forming an MOS device according to FIG. 3A. FIG. 3D shows dielectric material 338 filling the reentrant recess (see FIG. 3A, ref. num. 302), as well covering the gate structure 303 and other portions of the MOS substrate. In a particular embodiment, the dielectric material 338 is a low-k dielectric material that is applied in a fluid state, such as in a spin-on process. The fluid dielectric material flows into the reentrant recess before being cured (hardened). Examples of suitable spin-on fluid dielectric materials are sold under the trade name SILK by Dow of Midland, Mich.

In a particular embodiment, the dielectric material 338 does not create strain in the channel. In many MOS devices, strain is induced in the channel (such as by forming stress layers or stressed source/drain contacts (see FIG. 3G, ref. nums. 344, 346) and it is desirable that the dielectric material not counteract the channel strain or affect the channel strain in an uncontrolled manner. In a CMOS device, compressive stress is often induced in the PMOS half-cell, while tensile stress is often induced in the NMOS half-cell. Thus, it is particularly desirable to use a dielectric material that avoids creating or supporting stress (a "low-stress dielectric material") underneath the channel because a CMOS cell may have both types of stress, and a low-stress dielectric material may be used for both PMOS and NMOS devices. SiLK™ materials are desirable for this reason because they cure to a relatively porous state, and hence are relatively soft. Thus, they do not generate or support appreciable stress that might otherwise arise due to thermal expansion mismatch or as an artifact of the manufacturing process. Other soft dielectric materials are alternatively used, as are hard dielectric materials that do not generate appreciable stress underneath the channel.

FIG. 3E shows the partially fabricated MOS device of FIG. 3D after the dielectric material has been removed essentially everywhere except beneath the source/drain spacers 330, 332 and the gate structure. In a particular embodiment, an anisotropic etch technique is used to remove the unwanted dielectric material. An embedded dielectric structure 340 has been formed beneath the channel 317. The embedded dielectric structure 340 reduces the capacitance between the active channel (i.e., that portion of the channel that is within the well) and the substrate 306. The embedded dielectric structure 340 also reduces $C_{D/S\ sidewall}$, as further discussed in reference to FIG. 3G, and reduces the short channel effect because the embedded dielectric structure underlies the LDD and halo regions.

Figure 3F:
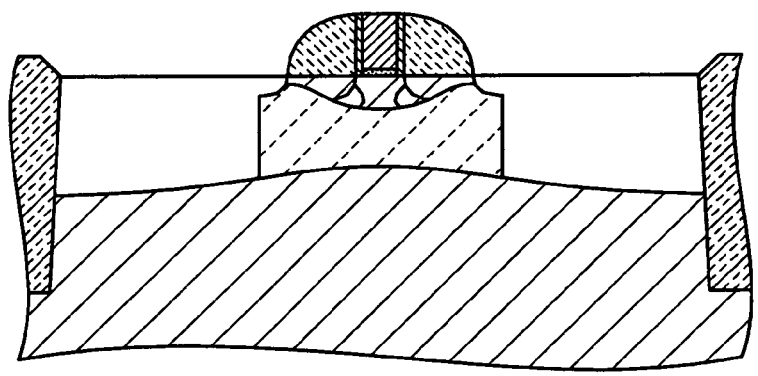
Figure 3G:
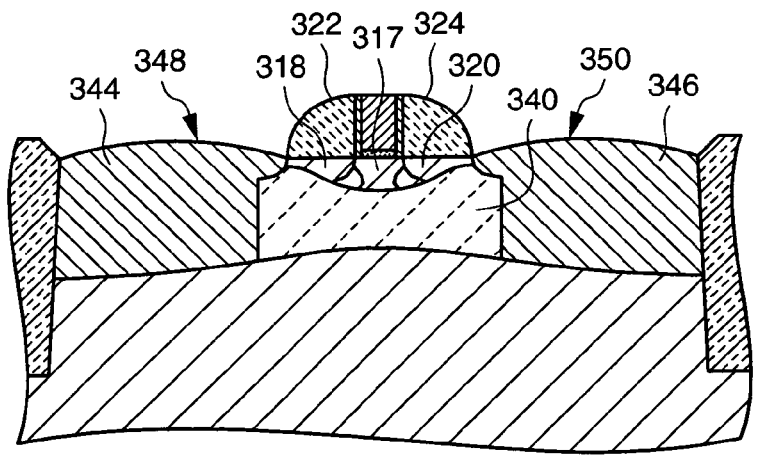

FIG. 3F shows the partially fabricated MOS device of FIG. 3E after the source drain spacers (see FIG. 3E, ref. nums. 330, 332) have been removed. FIG. 3G shows the partially fabricated MOS device of FIG. 3F after source/drain contacts 344, 346 have been formed. In a particular embodiment, the source/drain contacts 344, 346 are formed using a selective epitaxy growth ("SEG") technique. The source/drain contacts 344, 346 are SEG silicon, or alternatively, SEG SiGe or SEG SiC. During SEG, material grows on the exposed Si in the source/drain areas, i.e., on the silicon exposed by the reentrant recesses (see FIG. 3A, ref. num. 302), but not covered by the embedded dielectric structure 340. In yet other embodiments, the source/drain contacts are deposited using chemical vapor deposition ("CVD") techniques. Material formed by either SEG or CVD can be doped in situ to form source and drain terminals 348, 350. In particular embodiments, doping is graded so that the material at the bottom of the contacts is less doped than the material at the top of the contacts. Alternatively, a conventional source/drain implant is performed to form the source drain terminals.

The source/drain contacts 344, 346 are adjacent and electrically connected to the source/drain extensions 318, 320, which are usually lightly doped regions. The embedded dielectric structure 340 extends beneath the second sidewall spacers 322, 324 and the channel region 317, which reduces capacitance. The embedded dielectric structure 302 also reduces channel leakage current, thus reducing power consumption of the MOS device, and improves DIBL.

Figure 4:
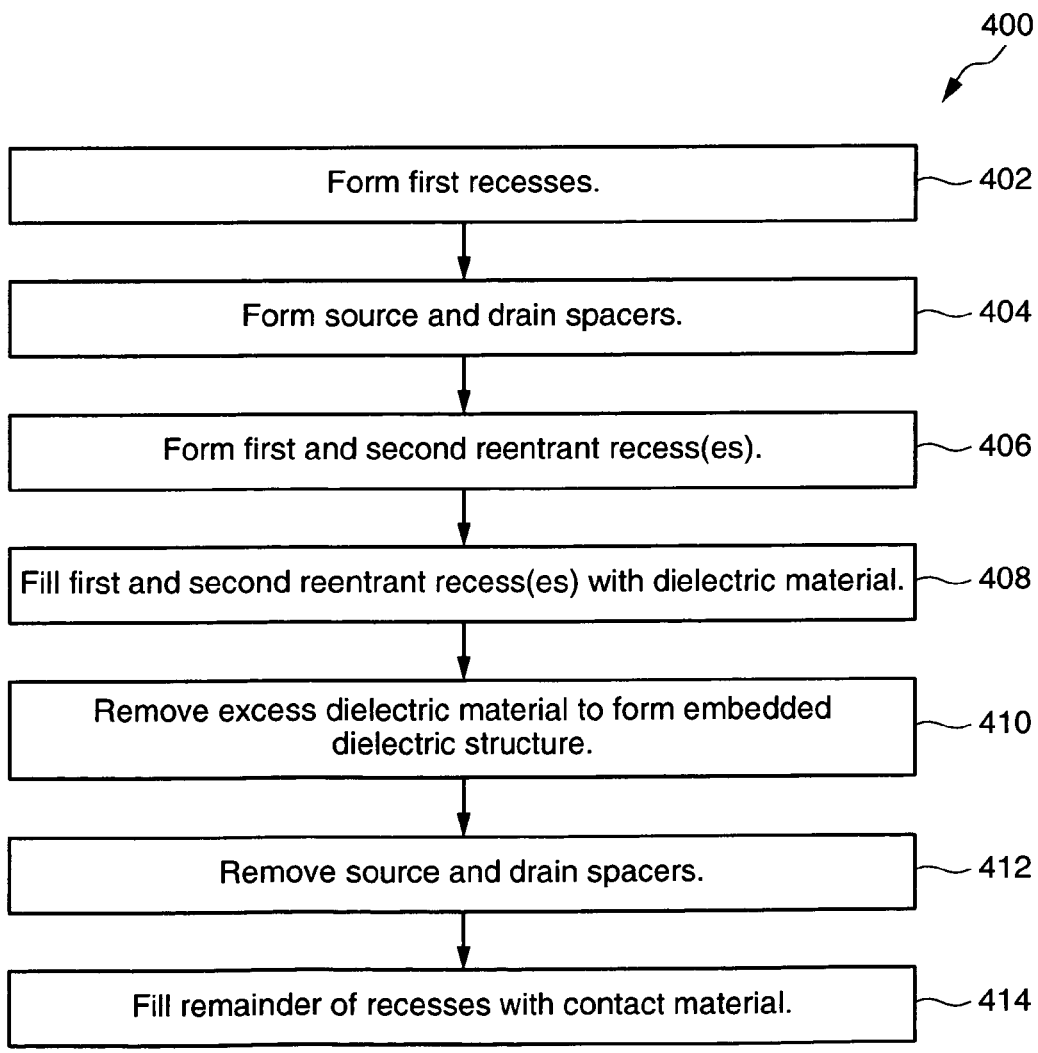
FIG. 4 is a flow chart of a method of fabricating an MOS device according to an embodiment of the invention.

FIG. 4 is a flow chart of a method 400 of fabricating an MOS device according to an embodiment of the invention. First recesses are formed to a first selected depth in source and drain regions of the MOS device (step 402). In a particular embodiment, the selected depth is less than the depth of lightly-doped material in the source and drain regions, and exposes the ends of the source and drain extensions. Source and drain spacers extending into the first recesses are formed adjacent to first and second sidewall spacers so as to cover the source/drain extensions (step 404). First and second reentrant recess extending beneath at least one of the source/drain extension regions are formed (step 406). In a particular embodiment, the first reentrant recess extends from the source region, beneath a channel region of the MOS device to merge with the second reentrant recess in a drain region of the MOS device. In an alternative embodiment, a first reentrant recess extends beneath the first sidewall spacer on a first side of a gate electrode and a second reentrant recess extends beneath the second sidewall spacer on a second side of a gate electrode, with an intervening web of silicon extending along the width of the channel between the first and second reentrant recesses connecting the channel to the bulk of the semiconductor wafer.

The reentrant recess is filled with dielectric material (step 408), and excess dielectric material is removed so as to form an embedded dielectric structure (step 410). In a particular embodiment, the dielectric material is applied in a fluid state and cured. In an alternative embodiment, the dielectric material is deposited into the reentrant recess(es) using a chemical vapor and/or plasma technique. The embedded dielectric structure extends beneath at least one of the first and second LDD regions. In a particular embodiment, the embedded dielectric structure extends beneath a source extension region and beneath a drain extension region with an intervening web of silicon connecting the channel to the bulk of the silicon.

The source and drain spacers are removed (step 412), and a remaining portion of the recess(es) is filled with source/drain contact material to form source and drain contacts (step 414). In a particular embodiment, the source and drain contacts are adjacent and electrically connected to source and drain extensions.

FIG. 5 is a plan view of an FPGA 500 with MOS devices according to an embodiment of the invention. The FPGA is an integrated circuit that may include CMOS portions in several of the functional blocks, such as in RAM and logic, and may be fabricated using a CMOS fabrication process. The MOS devices according to one or more embodiments of the invention are incorporated in any of several functional blocks, such as a memory block, logic block, I/O block, clock circuit, transceiver, or other functional block; within many functional blocks; or within a physical section or segment of the FPGA 500. MOS devices according to the invention are particularly desirable in FPGAs (or other integrated circuits having programmable logic) for at least two reasons. First, different users often have different speed requirements. Providing a faster logic block by reducing the MOS device capacitance allows the FPGA to be used in a wider variety of user applications. Second, many transistors in an FPGA might be idle much of the time that the FPGA is in use, depending on the user's application. It is particularly important to reduce the leakage current in idle devices of the FPGA to reduce the over-all power consumption.

The FPGA architecture may include a large number of different programmable tiles such as multi-gigabit transceivers (MGTs 501), configurable logic blocks (CLBs 502), random access memory blocks (BRAMs 503), input/output blocks (IOBs 504), configuration and clocking logic (CONFIG/CLOCKS 505), digital signal processing blocks (DSPs 506), specialized input/output blocks (I/O 507) (e.g., configuration ports and clock ports), and other programmable logic 508 such as digital clock managers, analog-to-digital converters, system monitoring logic, and so forth. Some FPGAs also include one or more dedicated processor blocks (PROC 510).

In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA. The programmable interconnect element (INT 511) also includes the connections to and from the programmable logic element within the same tile, as shown by the examples included at the top of FIG. 5.

For example, a CLB 502 can include a configurable logic element (CLE 512) that can be programmed to implement user logic plus a single programmable interconnect element (INT 511). A BRAM 503 can include a BRAM logic element (BRL 513) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 506 can include a DSP logic element (DSPL 514) in addition to an appropriate number of programmable interconnect elements. An IOB 504 can include, for example, two instances of an input/output logic element (IOL 515) in addition to one instance of the programmable interconnect element (INT 511). As will be clear to those of skill in the art, the actual I/O pads connected, for example, to the I/O logic element 515 are manufactured using metal layered above the various illustrated logic blocks, and typically are not confined to the area of the input/output logic element 515. In the pictured embodiment, a columnar area near the center of the die (shown shaded in FIG. 5) is used for configuration, clock, and other control logic.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art. For example, other materials may be used for the embedded dielectric, or other processing sequences may be followed. Therefore, the spirit and scope of the appended claims should not be limited to the foregoing description.

We claim:

1. A metal-oxide-semiconductor ("MOS") device comprising:
   a gate electrode having sidewalls;
   a first sidewall spacer extending from the gate electrode toward a source region;
   a second sidewall spacer extending from the gate electrode toward a drain region;
   a source extension extending at least partially beneath the first sidewall spacer;
   a drain extension extending at least partially beneath the second sidewall spacer;
   a body;
   a channel portion;
   a first embedded dielectric structure extending at least partially beneath the source extension;
   a second embedded dielectric structure extending at least partially beneath the drain extension; and
   a web disposed between the first embedded dielectric structure and the second embedded dielectric structure, the web connecting the channel portion to the body, wherein a portion of at least one of the first embedded dielectric structure and the second embedded dielectric structure extends directly below an area defined by the channel portion toward the web and between the channel portion and the body.

2. The MOS device of claim 1 wherein the source extension comprises a first lightly-doped region and the drain extension comprises a second lightly-doped region.

3. The MOS device of claim 1 wherein each of the first embedded dielectric structure and the second embedded dielectric structure comprises dielectric material applied to the MOS device in a fluid form.

4. The MOS device of claim 1 further comprising a halo region, wherein the embedded dielectric structure is proximate to at least one of the source extension and the drain extension, and is also proximate to the halo region.

5. The MOS device of claim 1 wherein each of the first embedded dielectric structure and the second embedded dielectric structure comprises low-k dielectric material.

6. A field programmable gate array having a MOS device according to claim 1.

7. A metal-oxide-semiconductor ("MOS") device comprising:
   a gate electrode having sidewalls;
   a first sidewall spacer extending from the gate electrode toward a source region;
   a second sidewall spacer extending from the gate electrode toward a drain region;
   a source extension extending at least partially beneath the first sidewall spacer;
   a drain extension extending at least partially beneath the second sidewall spacer;
   a body;
   a channel;
   at least a portion of an embedded dielectric structure extending from the source region toward the drain region directly below an area defined by a first portion of the channel and between the first portion of the channel and the body, wherein a remaining portion of the channel connects the channel to the body so as to avoid floating body effect.

8. The MOS device of claim 7 wherein the remaining portion of the channel is at a first end of the channel.

9. The MOS device of claim 8 further comprising a second remaining portion of the channel connecting the channel to the body at a second end of the channel.

10. The MOS device of claim 7 wherein the embedded dielectric structure comprises low-stress dielectric material.

11. The MOS device of claim 7 wherein the embedded dielectric structure comprises porous dielectric material.

12. A method of fabricating a metal-oxide-semiconductor ("MOS") device comprising:
   forming a gate electrode having sidewalls with a first sidewall spacer extending from the gate electrode toward a source region and a second sidewall spacer extending from the gate electrode toward a drain region, a source extension extending at least partially beneath the first sidewall spacer and a drain extension extending at least partially beneath the second sidewall spacer;
   forming first recesses to a first selected depth in the source region and in the drain region of the MOS device;
   forming a source spacer and a drain spacer;
   forming a first reentrant recess in the source region and a second reentrant recess in the drain region;
   filling the first reentrant recess and the second reentrant recess with dielectric material;
   removing excess dielectric material so as to form at least one embedded dielectric structure, wherein at least a portion of the at least one embedded dielectric structure extends from the source region toward the drain region directly below an area defined by a first portion of a channel and between the first portion of the channel and a body, wherein a remaining portion of the channel connects the channel to the body so as to avoid floating body effect;
   removing the source spacer and the drain spacer; and
   filling remaining portions of the first reentrant recess, the second reentrant recess, and the first recesses with contact material.

13. The method of claim 12 wherein the dielectric material is a low-stress dielectric material.

14. The method of claim 12 wherein the step of filling the first reentrant recess and the second reentrant recess with dielectric material comprises applying a fluid.

15. The method of claim 14 wherein the step of filling the first reentrant recess and the second reentrant recess with dielectric material further comprises curing the fluid to form a porous dielectric material.

16. The method of claim 12 wherein the first selected depth is greater than a depth of a halo implant.

17. The method of claim 12 further comprising steps, after the step of filling remaining portions of the first reentrant recess, the second reentrant recess, and the first recesses with contact material, of:
   implanting dopant into the contact material so as to form a lightly doped drain region and a lightly doped source region;
   forming gate sidewall spacers over a portion of source contact material and over a portion of drain contact material; and
   implanting dopant into the source contact material so as to form a source contact and into the drain contact material so as to form a drain contact.

* * * * *